(12) United States Patent
Fuller et al.

(10) Patent No.: US 6,627,970 B2
(45) Date of Patent: Sep. 30, 2003

(54) INTEGRATED SEMICONDUCTOR CIRCUIT, IN PARTICULAR A SEMICONDUCTOR MEMORY CIRCUIT, HAVING AT LEAST ONE INTEGRATED ELECTRICAL ANTIFUSE STRUCTURE, AND A METHOD OF PRODUCING THE STRUCTURE

(75) Inventors: Robert Fuller, Mechanicsville, VA (US); Helmut Schneider, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/742,131

(22) Filed: Dec. 20, 2000

(65) Prior Publication Data

US 2002/0074619 A1 Jun. 20, 2002

(51) Int. Cl.[7] .............. H01L 27/00; H01L 31/058; H01L 27/095; H01L 29/47; H01L 29/812
(52) U.S. Cl. .............. 257/530; 257/529; 257/471; 257/472; 257/474; 438/131; 438/132
(58) Field of Search ............... 257/499–508, 257/529, 530, 471, 484, 472, 474

(56) References Cited

U.S. PATENT DOCUMENTS

| 4,569,120 | A | * | 2/1986 | Stacy et al. | 29/574 |
|---|---|---|---|---|---|
| 5,057,451 | A | * | 10/1991 | McCollum | 437/69 |
| 5,159,207 | A | * | 10/1992 | Pavlin et al. | 307/296.2 |
| 5,324,681 | A | * | 6/1994 | Lowrey et al. | 437/52 |
| 5,485,027 | A | * | 1/1996 | Williams et al. | 257/343 |
| 5,614,755 | A | * | 3/1997 | Hutter et al. | 257/741 |
| 5,619,063 | A | * | 4/1997 | Chen et al. | 257/530 |
| 5,656,534 | A | * | 8/1997 | Chen et al. | 438/600 |
| 5,804,849 | A | * | 9/1998 | Wennekers | 257/280 |
| 5,851,882 | A | * | 12/1998 | Harshfield | 438/275 |
| 6,087,707 | A | * | 7/2000 | Lee et al. | 257/530 |
| 6,218,722 | B1 | * | 4/2001 | Cervin-Lawry et al. | 257/530 |
| 6,252,293 | B1 | * | 6/2001 | Seyyedi et al. | 257/530 |
| 6,335,228 | B1 | * | 1/2002 | Fuller et al. | 438/131 |
| 6,448,627 | B1 | * | 9/2002 | Chor | 257/530 |

FOREIGN PATENT DOCUMENTS

GB 2222024 A * 2/1990 ............ 257/530

* cited by examiner

Primary Examiner—Eddie Lee
Assistant Examiner—Jesse A. Fenty
(74) Attorney, Agent, or Firm—Laurence A. Greenberg; Werner H. Stemer; Gregory L. Mayback

(57) ABSTRACT

An integrated semiconductor circuit, in particular a semiconductor memory circuit, having at least one integrated electrical antifuse structure is described. The antifuse structure is located within an insulated well composed of semiconductor material.

8 Claims, 1 Drawing Sheet

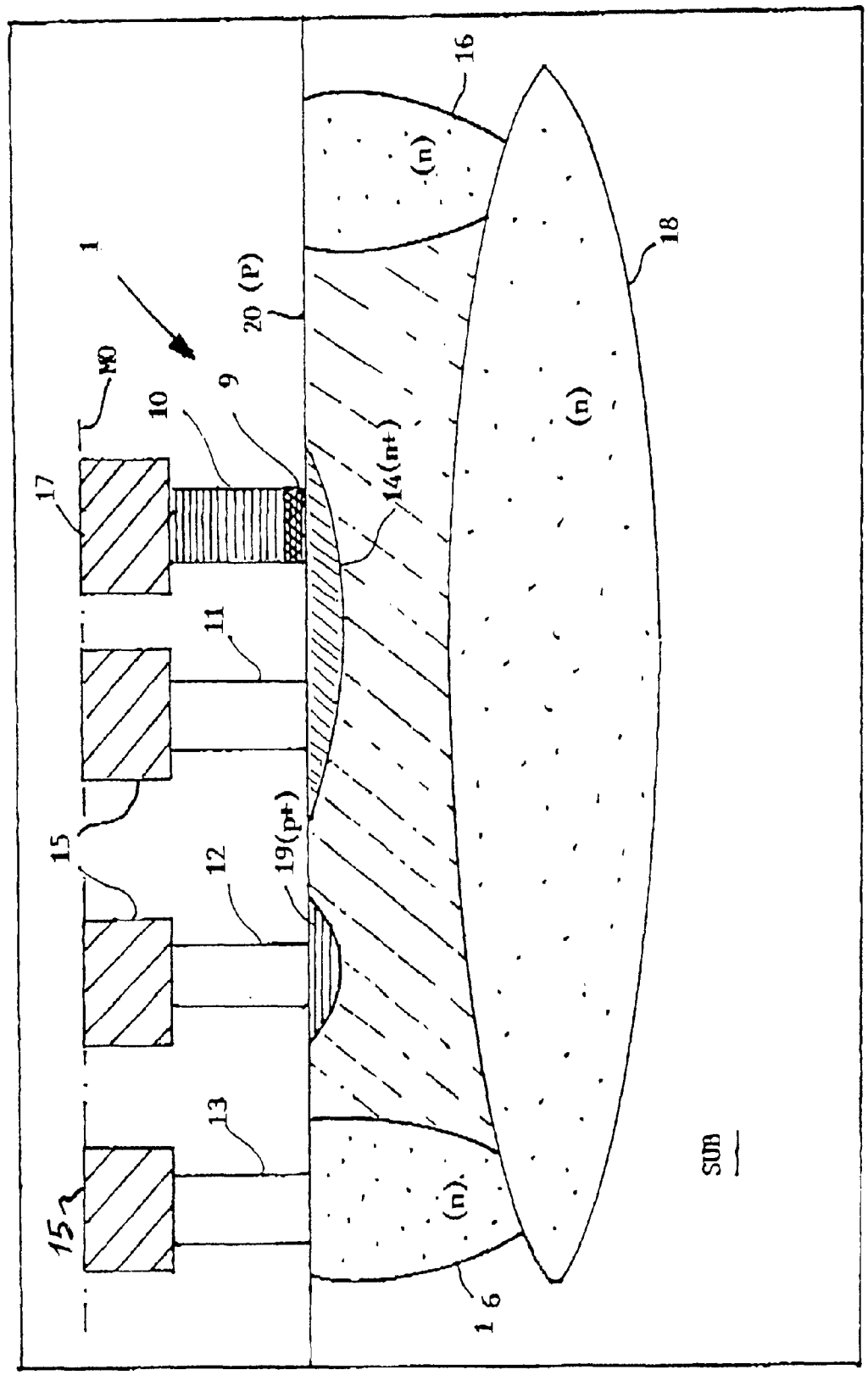

INTEGRATED SEMICONDUCTOR CIRCUIT, IN PARTICULAR A SEMICONDUCTOR MEMORY CIRCUIT, HAVING AT LEAST ONE INTEGRATED ELECTRICAL ANTIFUSE STRUCTURE, AND A METHOD OF PRODUCING THE STRUCTURE

BACKGROUND OF THE INVENTION

Field of the Invention

The invention relates to an integrated semiconductor circuit, in particular a semiconductor memory circuit, having at least one integrated electrical antifuse structure, and to a method for producing the structure.

In integrated semiconductor circuits and, within this category, in particular integrated semiconductor memory circuits, antifuse structures are used inter alia to define or to vary specific operating conditions and configurations of the semiconductor circuit during production or else during operation, for example test operation. In antifuse structures which can be driven electrically, semiconductor regions which are initially electrically insulated from one another and one of which has an antifuse isolator are electrically connected to one another by application of a drive voltage (burning voltage). Until now, such electrical antifuse structures were provided in the region of the contact planes or, if this were not the case, the potentials which could be used for the operating voltages used could not be selected as required, since they could not be selected independently of the chip-internal voltages.

SUMMARY OF THE INVENTION

It is accordingly an object of the invention to provide an integrated semiconductor circuit, in particular a semiconductor memory circuit, having at least one integrated electrical antifuse structure, and a method for producing the structure which overcome the above-mentioned disadvantages of the prior art methods and devices of the general type, in which operating voltages can be selected independently of the chip-internal voltages.

With the foregoing and other objects in view there is provided, in accordance with the invention, an integrated semiconductor circuit including semiconductor memory circuits. The circuit contains an insulated well formed of a semiconductor material, and an integrated electrical antifuse structure disposed within the insulated well.

According to the invention, the object is achieved by an electrical antifuse structure that is located in an insulated well formed in a semiconductor substrate. It is thus possible to assign any required potentials to the two electrodes. For example, the electrical antifuse structure is produced within a p-well which is insulated and surrounded by an n-well buried in a p substrate. In this way, all the operating voltages that are used in the integrated electrical antifuse structure can be selected independently of the internal chip voltages. In particular, a read voltage may assume any required value with respect to any required reference potential. A burning voltage, by which the electrodes in the antifuse structure are electrically connected to one another, can be applied in the direction of a reduced breakdown field strength; and the read voltage can be applied in the direction of a higher breakdown field strength, thus improving the reliability of the overall integrated semiconductor circuit.

In accordance with an added feature of the invention, the insulated well is a p-conductive well.

In accordance with an additional feature of the invention, there is a p-conductive substrate, an n-conductive well buried in the p-conductive substrate, and an n-conductive well wall composed of a further semiconductor material and disposed in the p-conductive substrate. The p-conductive well is surrounded and insulated by the n-conductive well and by the n-conductive well wall.

In accordance with another feature of the invention, the integrated electrical antifuse structure has a $p^+$ region and an $n^+$ region disposed within the p-conductive well; and an antifuse isolator is disposed on the $n^+$ region.

In accordance with a further feature of the invention, the p-conductive well has a surface, and the n-conductive well wall, the $n^+$ region and the $p^+$ region of the antifuse structure are exposed on the surface of the p-conductive well.

In accordance with another added feature of the invention, chip-select lines are connected to the $p^+$ region, the $n^+$ region, and the n-conductive well wall along the surface of the p-conductive well. A bit line contact is connected to the antifuse isolator and a metallization layer having an interconnect is conected to the bit line contact. In the alternative, the a conductive section can connected to the bit line contact.

In accordance with another additional feature of the invention, drive potentials for the integrated electrical antifuse structure can be selected as required.

With the foregoing and other objects in view there is further provided, in accordance with the invention, a method for producing an integrated semiconductor circuit. The method includes providing a substrate, forming an insulated well in the substrate which is insulated from the substrate and is composed of a semiconductor material, and forming an electrical antifuse structure within the insulated well.

In accordance with an added feature of the invention, there are the steps of forming the substrate as a p-conductive substrate, producing a buried well formed of n-conductive semiconductor sections in the p-conductive substrate, and forming the insulated well as a p-conductive region within the buried well.

In accordance with a concomitant feature of the invention, the step of forming the electrical antifuse structure includes:

forming a highly doped $p^+$ region within the insulated well;

forming a highly doped $n^+$ region alongside and isolated from the highly doped $p^+$ region within the insulated well, such that the highly doped $n^+$ region and the highly doped $p^+$ region are exposed on a surface of the insulated p-well;

connecting some of the n-conductive semiconductor sections of the buried well which are exposed on the surface of the insulated well to contacts;

connecting the highly doped $p^+$ region and the highly doped $n^+$ region to the contacts;

forming an antifuse isolator region on the highly doped $n^+$ region;

forming a bit line contact on the antifuse isolator region; and connecting the antifuse isolator region through the bit line contact to metal interconnects disposed in a metallization layer.

In the alternative, the bit line can be connected to conductive sections of the integrated semiconductor circuit.

Other features which are considered as characteristic for the invention are set forth in the appended claims.

Although the invention is illustrated and described herein as embodied in an integrated semiconductor circuit, in particular a semiconductor memory circuit, having at least one integrated electrical antifuse structure, and a method for producing the structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE of the drawing is a diagrammatic, sectional view of a semiconductor circuit.

DESCRIPTION OF THE PREFERRED EMBODIMENTS

Referring now to the single FIGURE of the drawing in detail, there is shown an electrical antifuse structure 1, which is shown schematically in the form of a section view. The antifuse structure 1 is located in a well 20 which is composed, for example, of a p-conductive semiconductor material and is insulated from a surrounding substrate SUB, which is composed, for example, of the p-conductive semiconductor material, by a well 18, which is buried in the substrate SUB with an associated side wall 16. The well 18 and the side wall 16 are formed, for example, from an n-conductive semiconductor material.

An n$^+$ region 14 and a p$^+$ region 19 are formed alongside one another, and electrically isolated, within the p-well 20 which is insulated in this manner. Located on the n$^+$ region 14 is an antifuse isolator 9 which is connected by a bit line contact 10 to a metal interconnect 17 in a metallization layer M0. In the same way, the n$^+$ region 14 of the antifuse structure 1 is connected by a contact 11 to a corresponding metal interconnect 15 in the same metallization layer M0. The p$^+$ region 19 is connected via a contact 12 to a corresponding metal interconnect 15 in the metallization layer M0.

The figure also shows that the n$^+$ region 14, the p$^+$ region 19 and the side wall 16 of the buried n-well are exposed on the surface of the p-well 20. There, the side wall 16 of the n-well is also connected via a contact 13 to the interconnect 15 in the metallization layer M0.

In order to produce the electrical antifuse structure 1 shown in the figure, the buried n-well 18 is first of all formed, with its side wall 16, in the substrate SUB, and the p-well 20 is then formed in this region, which is insulated by the n-well. Then, the highly doped n$^+$ region 14 and the highly doped p$^+$ region 19 are formed from the surface of the p-well 20 such that they are electrically isolated from one another. The antifuse isolator 9 can then be formed on the highly doped n$^+$ region 14, with the contact 10 and the contacts 11, 12, 13 being formed above it, so that these contacts respectively connect the n$^+$ region 14, the p$^+$ region 19 and the side wall 16 of the buried n-well to corresponding interconnect sections 15, 17 in the metallization layer M0.

As mentioned, the electrical antifuse structure 1 which is formed in the insulated well 20 according to the invention allows the drive potentials which are used to be selected as required, so that the read voltage may assume any required value with respect to any required reference potential, the burning voltage can be applied in the direction of a lower breakdown field strength, and the read voltage can be applied in the direction of a higher breakdown field strength.

We claim:

1. An integrated semiconductor circuit including a semiconductor memory circuit, comprising:
    an insulated well formed of a p-type semiconductor material;
    an integrated electrical antifuse structure disposed within said insulated well;
    a p-conductive substrate;
    an n-conductive well buried in said p-conductive substrate; and
    an n-conductive well wall composed of a further semiconductor material and disposed in said p-conductive substrate, said p-conductive well being surrounded and insulated by said n-conductive well and by said n-conductive well wall.

2. The integrated semiconductor circuit according to claim 1,
    wherein said integrated electrical antifuse structure has a p$^+$ region and an n$^+$ region disposed within said p-conductive well; and
    including an antifuse isolator disposed on said n$^+$ region.

3. The integrated semiconductor circuit according to claim 2, wherein said p-conductive well has a surface, and said n-conductive well wall, said n$^+$ region and said p$^+$ region of said antifuse structure are exposed on said surface of said p-conductive well.

4. The integrated semiconductor circuit according to claim 3, including:
    chip-select lines connected to said p$^+$ region, said n$^+$ region, and said n-conductive well wall along said surface of said p-conductive well;
    a bit line contact connected to said antifuse isolator; and
    a metallization layer having an interconnect connected to said bit line contact.

5. The integrated semiconductor circuit according to claim 3, including:
    chip-select lines connected to said p$^+$ region, said n$^+$ region, and said n-conductive well wall along said surface of said p-conductive well;
    a bit line contact connected to said antifuse isolator; and
    a conductive section connected to said bit line contact.

6. A method for producing an integrated semiconductor circuit, which comprises the following steps:
    providing a p-conductive substrate;
    producing a buried well formed of n-conductive semiconductor sections in the p-conductive substrate;
    forming an insulated well as a p-conductive region within the buried well in the substrate which is insulated from the substrate and is composed of a semiconductor material; and
    forming an electrical antifuse structure within the insulated well.

7. The method according to claim 6, wherein the forming of the electrical antifuse structure comprises the steps of:
    forming a highly doped p$^+$ region within the insulated well;
    forming a highly doped n$^+$ region alongside and isolated from the highly doped p$^+$ region within the insulated well, such that the highly doped n$^+$ region and the highly doped p$^+$ region are exposed on a surface of the insulated p-well;
    connecting some of the n-conductive semiconductor sections of the buried well which are exposed on the surface of the insulated well to contacts;

connecting the highly doped p$^+$ region and the highly doped n$^+$ region to the contacts;

forming an antifuse isolator region on the highly doped n$^+$ region;

forming a bit line contact on the antifuse isolator region; and connecting the antifuse isolator region through the bit line contact to metal interconnects disposed in a metallization layer.

8. The method according to claim 6, wherein the forming of the electrical antifuse structure comprises the steps of:

forming a highly doped p$^+$ region within the insulated well;

forming a highly doped n$^+$ region alongside and isolated from the highly doped p$^+$ region within the insulated well, such that the highly doped n$^+$ region and the highly doped p$^+$ region are exposed on a surface of the insulated well;

connecting some of the n-conductive semiconductor sections of the buried well which are exposed on the surface of the insulated p-well to contacts;

connecting the highly doped p$^+$ region and the highly doped n$^+$ region to the contacts;

forming an antifuse isolator region on the highly doped n$^+$ region;

forming a bit line contact on the antifuse isolator region; and connecting the antifuse isolator region through the bit line contact to conductive sections of the integrated semiconductor circuit.

\* \* \* \* \*